United States Patent
Zushi et al.

(10) Patent No.: US 10,230,294 B2
(45) Date of Patent: Mar. 12, 2019

(54) POWER CONVERSION DEVICE WITH GATE DRIVE CIRCUIT

(71) Applicant: NISSAN MOTOR CO., LTD., Yokohama-shi, Kanagawa (JP)

(72) Inventors: Yusuke Zushi, Kanagawa (JP); Tatsuhiro Suzuki, Kanagawa (JP); Keiichiro Numakura, Kanagawa (JP); Taku Shimomura, Kanagawa (JP); Tetsuya Hayashi, Kanagawa (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 0 days.

(21) Appl. No.: 15/575,963

(22) PCT Filed: May 22, 2015

(86) PCT No.: PCT/JP2015/064743
§ 371 (c)(1),
(2) Date: Nov. 21, 2017

(87) PCT Pub. No.: WO2016/189585
PCT Pub. Date: Dec. 1, 2016

(65) Prior Publication Data
US 2018/0152093 A1 May 31, 2018

(51) Int. Cl.
*H02M 1/08* (2006.01)
*H02M 5/458* (2006.01)
(Continued)

(52) U.S. Cl.
CPC ............. *H02M 1/08* (2013.01); *H02M 1/088* (2013.01); *H02M 5/4585* (2013.01);
(Continued)

(58) Field of Classification Search
CPC ...... H02M 1/08; H02M 5/4585; H02M 7/217; H02M 7/48; H03K 17/567;
(Continued)

(56) References Cited

U.S. PATENT DOCUMENTS 6,956,427 B2   10/2005   Kawasaki et al.
7,687,902 B2 *  3/2010   Shiraishi ............. H01L 23/3107
                                                        257/723
(Continued)

FOREIGN PATENT DOCUMENTS

JP         48-78432 A     10/1973
JP         51-090453 A     8/1976
(Continued)

*Primary Examiner* — Yemane Mehari
(74) *Attorney, Agent, or Firm* — Foley & Lardner LLP

(57) ABSTRACT

A power conversion device includes a gate voltage adjustment unit (a detection circuit 12) which acts on a drive signal from a gate drive circuit 11 that sends a drive signal to the respective gates of a plurality of semiconductor elements Q1 to Q2 provided in parallel, and which adjusts the gate voltages of the semiconductor elements. The gate voltage adjustment unit superimposes an induction voltage generated on the basis of a difference between a magnetic flux due to a current flowing through one of the plurality of semiconductor elements and a magnetic flux due to a current flowing through each of the other semiconductor elements, onto a gate voltage sent to at least one gate of the plurality of semiconductor elements.

9 Claims, 10 Drawing Sheets

(51) Int. Cl.
*H02M 7/217* (2006.01)
*H02M 7/48* (2007.01)
*H03K 17/567* (2006.01)
*H02M 1/088* (2006.01)
*H02M 7/537* (2006.01)
*H03K 17/082* (2006.01)
*H03K 17/12* (2006.01)
*H03K 17/16* (2006.01)
*H02M 1/00* (2006.01)

(52) U.S. Cl.
CPC ............. *H02M 7/217* (2013.01); *H02M 7/48* (2013.01); *H02M 7/537* (2013.01); *H03K 17/0822* (2013.01); *H03K 17/122* (2013.01); *H03K 17/165* (2013.01); *H03K 17/567* (2013.01); *H02M 2001/0006* (2013.01); *H03K 2217/0081* (2013.01)

(58) Field of Classification Search
CPC ........... H01L 29/41766; H01L 29/7813; H01L 29/0623; H01L 29/7801; H01L 29/0629; H01L 29/66068; H01L 29/7803; H01L 29/7805; H01L 29/7806; H01L 29/165; H01L 29/4238; H01L 29/1608

USPC .... 323/98, 123; 257/77, 133, 328, 329, 334, 257/341, 368, 509, 723

See application file for complete search history.

(56) References Cited

U.S. PATENT DOCUMENTS

| | | | |
|---|---|---|---|
| 8,188,545 B2* | 5/2012 | Saiki | G02F 1/13452 257/355 |
| 8,592,904 B2* | 11/2013 | Shiraishi | H01L 23/3107 257/341 |
| 2003/0156439 A1* | 8/2003 | Ohmichi | H02M 7/538 363/98 |
| 2004/0232971 A1 | 11/2004 | Kawasaki et al. | |
| 2010/0117225 A1* | 5/2010 | Shiraishi | H01L 23/3107 257/723 |

FOREIGN PATENT DOCUMENTS

| | | |
|---|---|---|
| JP | 07-177727 A | 7/1995 |
| JP | 11-041909 A | 2/1999 |
| JP | 2004-274262 A | 9/2004 |
| JP | 2012-039790 A | 2/2012 |
| JP | 2014-060425 A | 4/2014 |
| JP | 2015-023774 A | 2/2015 |

* cited by examiner

POWER CONVERSION DEVICE WITH GATE DRIVE CIRCUIT

TECHNICAL FIELD

The present invention relates to a power conversion device which converts a direct current (DC) power to an alternating current (AC) power.

BACKGROUND ART

As a device which converts a direct current (DC) power from a battery to an alternating current (AC) power, there is known a power conversion device disclosed in, for example, Patent Literature 1. This power conversion device includes a semiconductor element as a strong electric relay, and the semiconductor element turns on/off the power feeding from a battery. Furthermore, as the power conversion device using a semiconductor element as a strong electric relay, there is known the one having a plurality of semiconductor elements provided in parallel therein in order to distribute the electric current flowing through a semiconductor element.

In the power conversion device having a plurality of semiconductor elements provided in parallel therein, there may be cases where either one of the semiconductor elements is turned on earlier than each of the other semiconductor elements since the threshold voltage at which a semiconductor element is turned on is different for each semiconductor element. Accordingly, the conventional power conversion device includes a reactor downstream of the emitter of a semiconductor element, and suppresses, on the basis of an induction voltage generated by the reactor, an increase in the electric current flowing through a semiconductor element to be turned on earlier, thereby achieving a balance between this current and the electric current flowing through another semiconductor element.

CITATION LIST

Patent Literature

Patent Literature 1: Japanese Patent Laid-Open Publication No. 11-41909

SUMMARY OF INVENTION

Technical Problem

However, the size of the reactor provided downstream of the emitter of a semiconductor element increases and thus the size of the entire conventional power conversion device increases. Namely, in the power conversion device, at the start of operation, the electric current supplied from a battery is required to be gradually increased in order to prevent a rush current, and thus the change rate of the electric current flowing through the reactor decreases and the induction voltage decreases. Accordingly, in order to ensure a balance between the electric currents flowing through the semiconductor elements of the conventional power conversion device, the induction voltage is required to be increased by an increase of the size of the reactor. As a result, the conventional power conversion device has a problem that the size of the entire device increases.

The present invention has been made in view of the above-described problem, and has an object to provide a power conversion device which can be miniaturized.

A power conversion device according to the present invention includes a gate voltage adjustment unit configured to adjust each gate voltage of a plurality of semiconductor elements provided in parallel. The gate voltage adjustment unit superimposes an induction voltage generated on the basis of a difference between a magnetic flux due to a current flowing through one of a plurality of semiconductor elements and a magnetic flux due to a current flowing through each of the other semiconductor elements, onto each gate voltage of the plurality of semiconductor elements.

DESCRIPTION OF EMBODIMENTS

Hereinafter, embodiments to which the present invention is applied will be explained with reference to the drawings. In the description of the drawings, the same reference sign is attached to the same part and the description thereof is omitted.

(First Embodiment)

Figure 1:
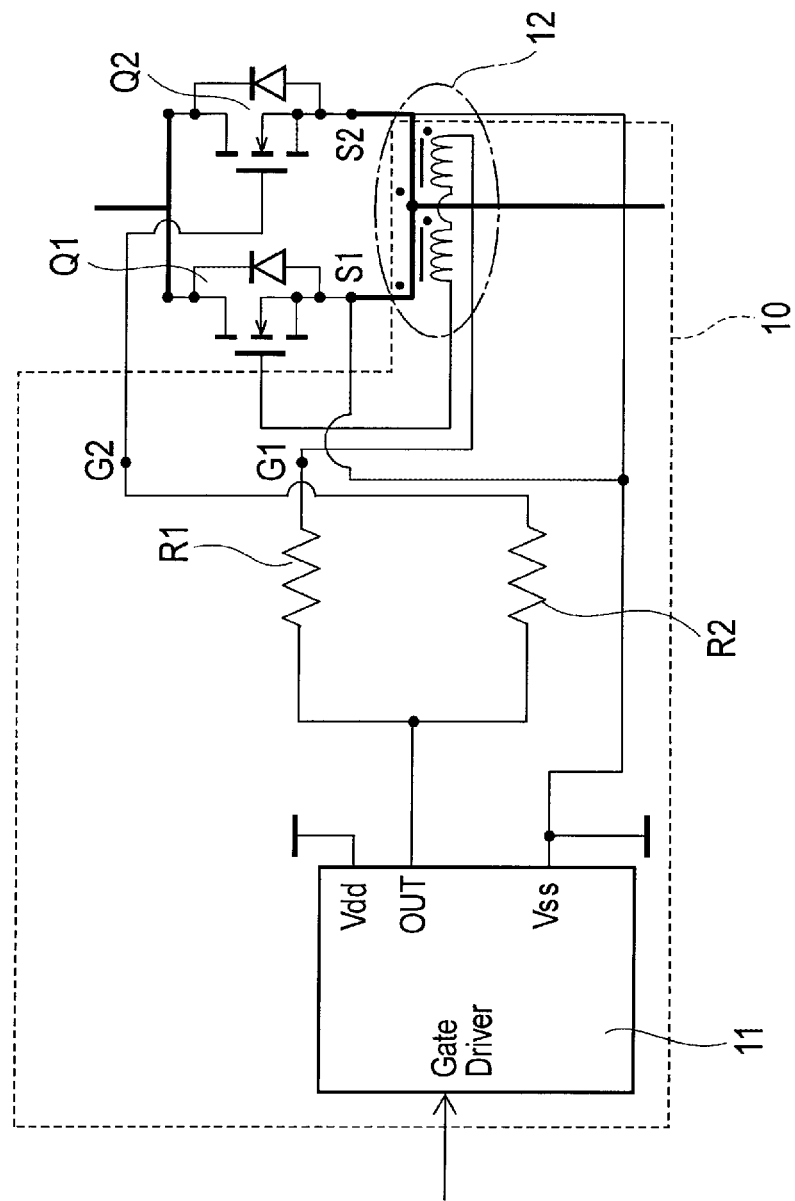
FIG. 1 illustrates a circuit configuration of a power conversion device according to a first embodiment of the present invention.

FIG. 1 illustrates a circuit configuration of a power conversion device according to a first embodiment of the present invention. This power conversion device includes a first semiconductor switch Q1, a second semiconductor switch Q2, a drive circuit 10 including a gate drive circuit 11, and a detection circuit 12. The first semiconductor switch Q1 and the second semiconductor switch Q2 correspond to a plurality of semiconductor elements of the present invention. The gate drive circuit 11 corresponds to the gate drive unit of the present invention. The detection circuit 12 corresponds to the gate voltage adjustment unit of the present invention.

Each of the first semiconductor switch Q1 and the second semiconductor switch Q2 includes a MOSFET (Metal-Oxide-Semiconductor Field-Effect Transistor), for example.

Alternatively, an IGBT (Insulated Gate Bipolar Transistor), a JFET (Junction Field-Effect Transistor), or the like may be used.

These first semiconductor switch Q1 and second semiconductor switch Q2 are connected in parallel. Namely, the drains or sources of the first semiconductor switch Q1 and the second semiconductor switch Q2 are connected to each other.

The drive circuit 10 includes the gate drive circuit 11, a first gate resistor R1, a second gate resistor R2, and the detection circuit 12. The gate drive circuit 11 sends a drive signal to each gate of the first semiconductor switch Q1 and the second semiconductor switch Q2. Furthermore, the first gate resistor R1 and the second gate resistor R2 respectively correspond to a speed control resistor of the present invention.

A positive power supply Vdd and a negative power supply Vss supply power to the gate drive circuit 11. The gate drive circuit 11 outputs a drive signal from an 3Q output terminal OUT in response to an external instruction. The output terminal OUT of the gate drive circuit 11 is connected to one of the respective terminals of the first gate resistor R1 and the second gate resistor R2 each functioning as a switching speed control resistor.

The other terminal of the first gate resistor R1 is connected to one of the terminals of the detection circuit 12. The other terminal of the detection circuit 12 is connected to the gate of the first semiconductor switch Q1. The gate drive circuit 11 sends a drive signal to the first semiconductor switch Q1 via the first gate resistor R1. The first gate resistor R1 has a function of suppressing a steep change of the electric current driving the gate of the first semiconductor switch Q1.

The other terminal of the second gate resistor R2 is connected to the gate of the second semiconductor switch Q2. The gate drive circuit 11 sends a drive signal to the second semiconductor switch Q2 via the second gate resistor R2. The second gate resistor R2 has a function of suppressing a steep change of the electric current driving the gate of the second semiconductor switch Q2. The first gate resistor R1 and the second gate resistor R2 are capable of enhancing the stability of the drive circuit 10 because of restricting the drive current even if a steep induction voltage is generated in the detection circuit 12.

The detection circuit 12 includes a pickup coil formed from a coiled wiring pattern. Note that the detection circuit 12 may be formed from a wiring wound in a coil shape. The detection circuit 12 acts on the drive signal from the gate drive circuit 11 to adjust the gate voltages of the first semiconductor switch Q and the second semiconductor switch Q2. The detection circuit 12 superimposes an induction voltage generated on the basis of a difference between a magnetic flux due to an electric current flowing through the source of the first semiconductor switch Q1 and a magnetic flux due to an electric current flowing through the source of the second semiconductor switch Q2, onto the gate voltage applied to the gate of the first semiconductor switch Q1.

Figure 2:
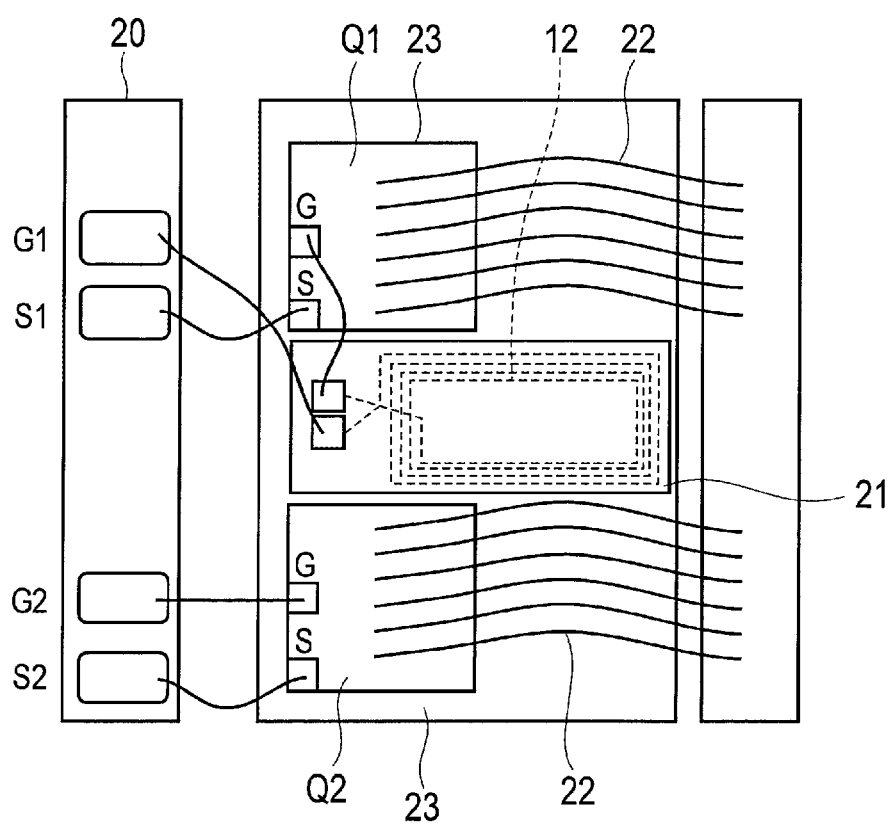
FIG. 2 illustrates a mounting configuration of the power conversion device according to the first embodiment of the present invention.

FIG. 2 illustrates a mounting configuration of the power conversion device according to the first embodiment of the present invention. A terminal plate 20 is provided with a gate terminal G1, a source terminal S1, a gate terminal G2, and a source terminal S2. The gate terminal G1 is connected to the first gate resistor R1, and the source terminal S is connected to the negative power supply Vss. In addition, the gate terminal G2 is connected to the second gate resistor R2, and the source terminal S2 is connected to the negative power supply Vss.

The gate terminal G1 is connected to the first gate resistor R1 (refer to FIG. 1) and is also connected to one end of the pickup coil forming the detection circuit 12, and the other end of the pickup coil is connected to a gate electrode G of the first semiconductor switch Q1. The source terminal S1 is connected to the negative power supply Vss (refer to FIG. 1) and is also connected to a source electrode S of the first semiconductor switch Q1. Similarly, the gate terminal G2 is connected to the second gate resistor R2 (refer to FIG. 1) and is also connected to the gate electrode G of the second semiconductor switch Q2, and the source terminal S2 is connected to the negative power supply Vss (refer to FIG. 1) and is also connected to the source electrode S of the second semiconductor switch Q2.

A lower-surface electrode pattern 23 is formed at positions corresponding to the respective first semiconductor switch Q1 and second semiconductor switch Q2 on a substrate having the first semiconductor switch Q1, the second semiconductor switch Q2, and an insulating member 21 mounted thereon. An upper-surface electrode extraction section 22 is provided on the upper surface of each of the first semiconductor switch Q1 and the second semiconductor switch Q2. The upper-surface electrode extraction section 22 can include a bonding wire, a bonding ribbon, a lead frame, or the like.

The operation of the power conversion device according to the first embodiment constituted as described above will be explained. Once the gate drive circuit 11 outputs a drive signal from the output terminal OUT, the drive signal is supplied to the gate of the first semiconductor switch Q1 via the first gate resistor R1 and the detection circuit 12. With this drive signal, an electric current flows through the source of the first semiconductor switch Q1 when the gate voltage is higher than a threshold at which the first semiconductor switch Q1 is turned on. Similarly, the drive signal output from the output terminal OUT of the gate drive circuit 11 is supplied to the gate of the second semiconductor switch Q2 via the second gate resistor R2. Accordingly, an electric current flows through the source of the second semiconductor switch Q2.

In this case, electric currents flowing through the sources of the respective first semiconductor switch Q1 and second semiconductor switch Q2 generate a magnetic flux around wirings from the sources. If there is a difference between a magnetic flux due to the electric current flowing through the source of the first semiconductor switch Q1 and a magnetic flux due to the electric current flowing through the source of the second semiconductor switch Q2, an induction voltage corresponding to the difference between the magnetic fluxes is generated in the detection circuit 12. The generated induction voltage is superimposed onto the gate voltage supplied to the gate of the first semiconductor switch Q1. Accordingly, when the threshold of the gate voltage of the first semiconductor switch Q1 is lower than that of the second semiconductor switch Q2, the electric current flowing through the source of the first semiconductor switch Q1 becomes larger the electric current flowing through the source of the second semiconductor switch Q2. However, in this case, a negative induction voltage is generated in the detection circuit 12 to suppress an increase in the gate voltage of the first semiconductor switch Q1 and thereby suppress an increase in the electric current flowing through the source of the first semiconductor switch Q1.

In contrast, when the threshold of the gate voltage of the first semiconductor switch Q1 is higher than that of the second semiconductor switch Q2, the electric current flowing through the source of the first semiconductor switch Q becomes smaller than the electric current flowing through the source of the second semiconductor switch Q2. In this case, a positive induction voltage is generated in the detection circuit 12 to promote an increase in the gate voltage of the first semiconductor switch Q1 and thereby promote an increase in the electric current flowing through the source of the first semiconductor switch Q1. As a result, in the present embodiment, the gate voltage of the semiconductor switch is adjusted so that the electric current flowing through the first semiconductor switch Q1 and the electric current flowing through the second semiconductor switch Q2 become equal.

As described above, with the power conversion device according to the first embodiment, it is possible to achieve a balance between the electric currents flowing through a plurality of semiconductor switches without providing a reactor downstream of the source of a semiconductor switch, and thus the power conversion device can be miniaturized.

Moreover, in the first embodiment described above, the detection circuit 12 is arranged between the first semiconductor switch Q1 and the second semiconductor switch Q2. In order to enhance transitional thermal performances of a plurality of semiconductor switches connected in parallel, it is preferable to distribute and mount these switches and to thereby increase the distance between the respective semiconductor switches. In the power conversion device according to the first embodiment, this is realized with the above-described arrangement.

Note that only one gate drive circuit 11 is provided in the above-described first embodiment, but the gate drive circuit 11 can also be provided for each semiconductor switch.

Note that, in the above description, in the power conversion device according to the present embodiment, a reactor may not be provided downstream of the source of a semiconductor switch, but is not necessarily limited thereto, and a reactor may be provided downstream of the source of a semiconductor switch. In the power conversion device according to the present embodiment, the gate voltage can be adjusted by the detection circuit 12 even if a reactor is provided downstream of the source of a semiconductor switch, and thus a large reactor is not required to be provided and the power conversion device can be miniaturized.

(Second Embodiment)

A power conversion device according to a second embodiment of the present invention individually controls the electric currents flowing through the first semiconductor switch Q and the second semiconductor switch Q2 of the power conversion device according to the first embodiment. Hereinafter, in the second embodiment, a description will be given while focusing on the portions different from the first embodiment.

Figure 3:
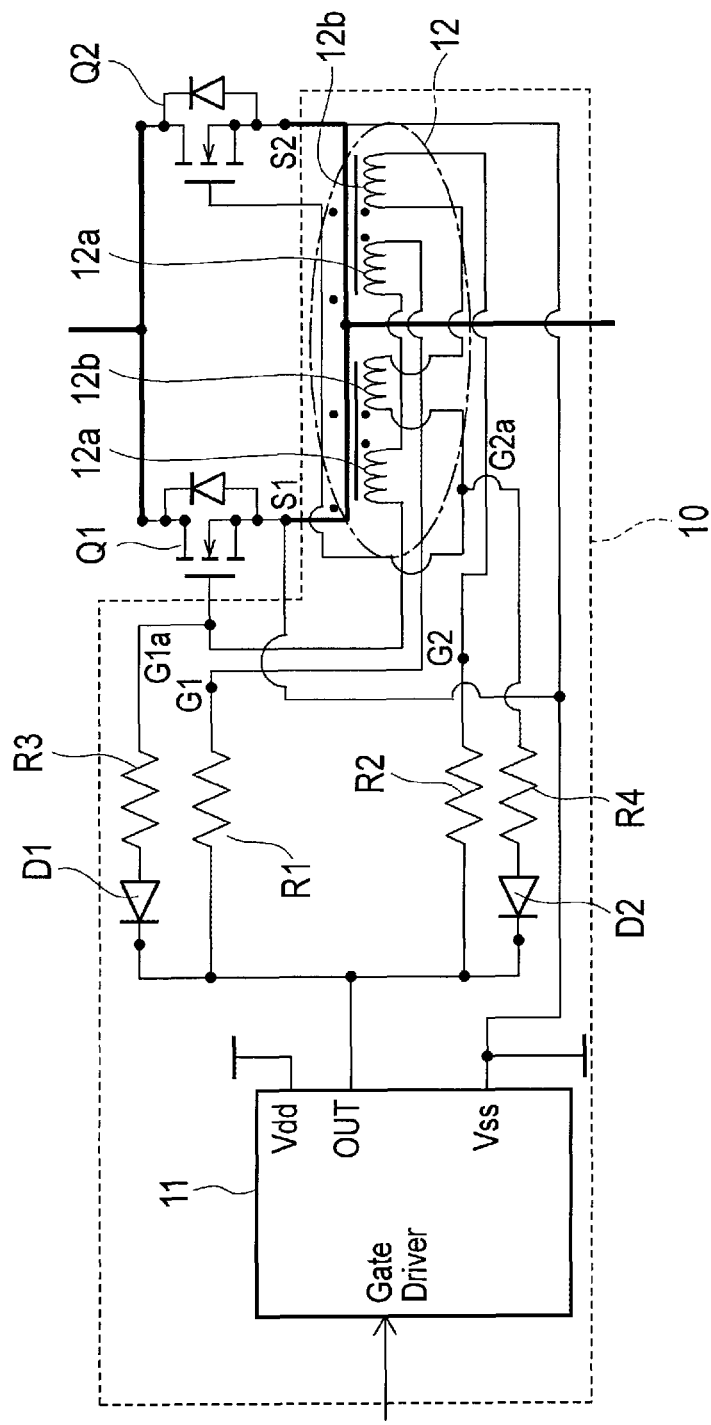
FIG. 3 illustrates a circuit configuration of a power conversion device according to a second embodiment of the present invention.

FIG. 3 illustrates the circuit configuration of the power conversion device according to the second embodiment of the present invention. This power conversion device is constituted by changing the inside of the drive circuit 10 of the power conversion device according to the first embodiment. Namely, the configuration and function of the detection circuit 12 according to the first embodiment are changed and a third gate resistor R3 for turn-off, a first diode D1, a fourth gate resistor R4 for turn-of and a second diode D2 are added.

The detection circuit 12 includes a first detection circuit 12a which controls the first semiconductor switch Q1 and a second detection circuit 12b which controls the second semiconductor switch Q2. The first detection circuit 12a and the second detection circuit 12b each correspond to the gate voltage adjustment section of the present invention. The first detection circuit 12a includes a pickup coil formed from a coiled wiring pattern. Note that the first detection circuit 12a can be constituted by a wiring wound in a coil shape. The first detection circuit 12a superimposes an induction voltage generated by the electric currents flowing through the sources of the respective first semiconductor switch Q1 and second semiconductor switch Q2, onto the drive signal from the gate drive circuit 11.

The second detection circuit 12b includes a pickup coil formed of a coiled wiring pattern. Note that the second detection circuit 12b can also be constituted by a wiring wound in a coil shape. The second detection circuit 12b superimposes an induction voltage generated by the electric currents flowing through the sources of the respective first semiconductor switch Q1 and second semiconductor switch Q2, onto the drive signal via the second gate resistor R2 from the gate drive circuit 11.

The pickup coil constituting the first detection circuit 12a and the pickup coil constituting the second detection circuit 12b are inductively coupled with each other. The inductive component decreases when the direction of the electric current flowing through the gate of the first semiconductor switch Q1 and the direction of the electric current flowing through the gate of the second semiconductor switch Q2 are the same, whereas the inductive component increases when the directions of the both are different from each other.

Furthermore, a series circuit including the third gate resistor R3 and the first diode D1 is provided between the output terminal OUT of the gate drive circuit 11 and the gate of the first semiconductor switch Q1. Similarly, a series circuit including the fourth gate resistor R4 and the second diode D2 is provided between the output terminal OUT of the gate drive circuit 11 and the gate of the second semiconductor switch Q2.

Figure 4:
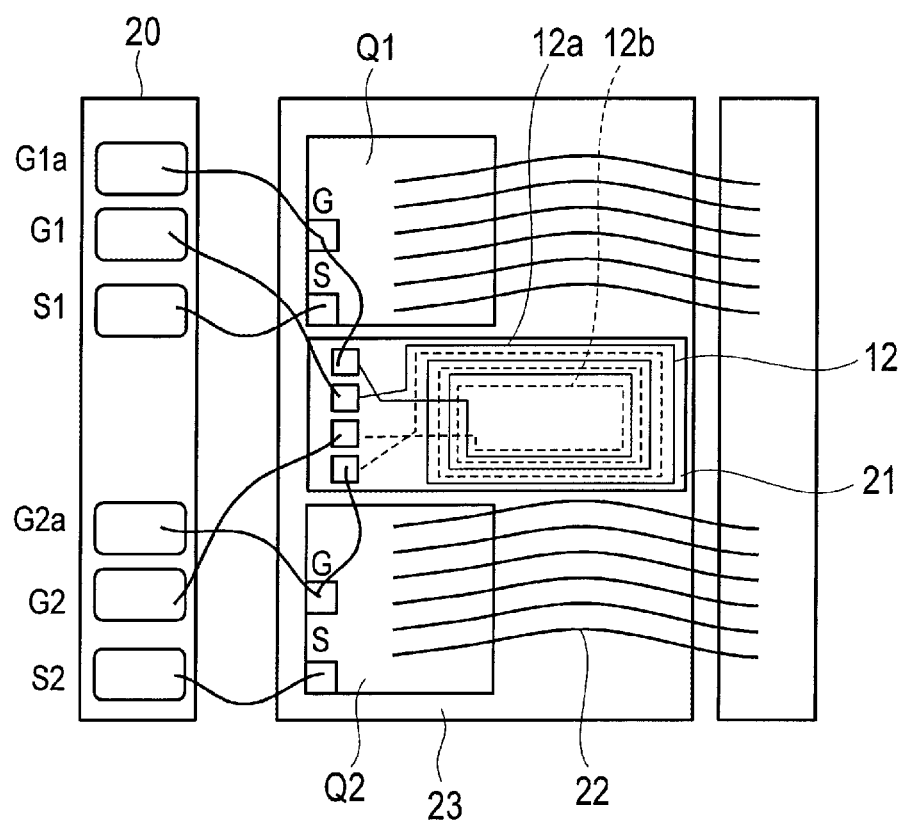
FIG. 4 illustrates a mounting configuration of the power conversion device according to the second embodiment of the present invention.

FIG. 4 illustrates a mounting configuration of the power conversion device according to the second embodiment of the present invention. The terminal plate 20 is constituted by adding a gate terminal G1a and a gate terminal G2a to the configuration of the first embodiment. The gate terminal G1a is connected to the third gate resistor R3, and the gate terminal G2a is connected to the fourth gate resistor R4.

The gate terminal G1 is connected to the first gate resistor R1 (refer to FIG. 3) and is also connected to one end of the pickup coil forming the first detection circuit 12a, and the other end of the pickup coil is connected to the gate electrode G of the first semiconductor switch Q1. The source terminal S1 is connected to the negative power supply Vss (refer to FIG. 3) and is also connected to the source electrode S of the first semiconductor switch Q1. Furthermore, the gate terminal G1a is connected to the third gate resistor R3 (refer to FIG. 3) and is also connected to the gate electrode G of the first semiconductor switch Q1.

Similarly, the gate terminal G2 is connected to the second gate resistor R2 (refer to FIG. 3) and is also connected to one end of the pickup coil forming the second detection circuit 12b, and the other end of the pickup coil is connected to the gate electrode G of the second semiconductor switch Q2. The source terminal S2 is connected to the negative power supply Vss (refer to FIG. 3) and is also connected to the source electrode S of the second semiconductor switch Q2. Furthermore, the gate terminal G2a is connected to the fourth gate resistor R4 (refer to FIG. 3) and is also connected to the gate electrode G of the second semiconductor switch Q2.

Hereinafter, the operation of the power conversion device according to the second embodiment constituted as described above will be explained. Once the gate drive circuit 11 outputs a drive signal from the output terminal OUT, the drive signal is supplied to the gate of the first semiconductor switch Q1 via the first gate resistor R1 and the first detection circuit 12a. Accordingly, an electric current flows through the source of the first semiconductor switch Q1. Similarly, the drive signal output from the output terminal OUT of the gate drive circuit 11 is supplied to the gate of the second semiconductor switch Q2 via the second gate resistor R2 and the second detection circuit 12b. Thus, an electric current flows through the source of the second semiconductor switch Q2.

In this case, electric currents flowing through the sources of the respective first semiconductor switch Q1 and second semiconductor switch Q2 generate a magnetic flux around wirings from the sources. When there is a difference between a magnetic flux due to the electric current flowing through the source of the first semiconductor switch Q1 and a magnetic flux due to the electric current flowing through the source of the second semiconductor switch Q2, an induction voltage corresponding to the difference between the magnetic fluxes is generated in the detection circuit 12. An induction voltage is generated in the first detection circuit 12a, and this generated induction voltage is superimposed onto the gate voltage supplied to the gate of the first semiconductor switch Q1. Furthermore, an induction voltage is generated in the second detection circuit 12b, and the induction voltage generated in the second detection circuit 12b is superimposed onto the gate voltage supplied to the gate of the second semiconductor switch Q2.

When the threshold of the gate voltage of the first semiconductor switch Q1 is lower than that of the second semiconductor switch Q2, the electric current flowing through the source of the first semiconductor switch Q1 becomes larger than the electric current flowing through the source of the second semiconductor switch Q2. In this case, a negative induction voltage is generated in the first detection circuit 12a to suppress an increase in the gate voltage of the first semiconductor switch Q1 and thereby suppress an increase in the electric current flowing through the source of the first semiconductor switch Q1. Furthermore, a positive induction voltage is generated in the second detection circuit 12b to promote an increase in the gate voltage of the second semiconductor switch Q2 and thereby promote an increase in the electric current flowing through the source of the second semiconductor switch Q2. As a result, in the present embodiment, the gate voltage of the semiconductor switch is adjusted so that the electric current flowing through the first semiconductor switch Q1 and the electric current flowing through the second semiconductor switch Q2 become equal.

In contrast, when the threshold of the gate voltage of the first semiconductor switch Q1 is higher than that of the second semiconductor switch Q2, the electric current flowing through the source of the first semiconductor switch Q1 becomes smaller than the electric current flowing through the source of the second semiconductor switch Q2. In this case, a positive induction voltage is generated in the first detection circuit 12a to promote an increase in the gate voltage of the first semiconductor switch Q1 and thereby promote an increase in the electric current flowing through the source of the first semiconductor switch Q1. Furthermore, a negative induction voltage is generated in the second detection circuit 12b to suppress an increase in the gate voltage of the second semiconductor switch Q2 and thereby suppress an increase in the electric current flowing through the source of the second semiconductor switch Q2. As a result, in the present embodiment, the gate voltage of the semiconductor switch is adjusted so that the electric current flowing through the first semiconductor switch Q1 and the electric current flowing through the second semiconductor switch Q2 become equal.

Moreover, since the third gate resistor R3 and the fourth gate resistor R4 for turn-off are connected to the first semiconductor switch Q1 and the second semiconductor switch Q2, respectively, without via the detection circuit 12, the gate current during turn-off does not pass through the detection circuit 12. As a result, the first semiconductor switch Q1 and the second semiconductor switch Q2 can be turned off at high speed.

Furthermore, in the power conversion device according to the second embodiment constituted as described above, the detection circuit 12 which adjusts the gate voltage is provided between the wirings (wirings from the main current path) routed from the respective sources of the first semiconductor switch Q1 and second semiconductor switch Q2. Therefore, an induction voltage is generated in the detection circuit 12 by the magnetic flux from the wiring from the main current path, and thus the induction voltage can be superimposed onto each gate voltage of the first semiconductor switch Q1 and the second semiconductor switch Q2.

In addition, the pickup coils formed by a coiled wiring pattern are inductively coupled to each other so that the mutual inductance decreases when the drive signal is sent to the gate. Accordingly, an increase in the gate voltage of a semiconductor element whose threshold voltage is low can be suppressed and an increase in the gate voltage of a semiconductor element whose threshold voltage is high can be promoted. Namely, the gate voltage can be adjusted by the utilization of the induction voltage generated in the detection circuit 12, and thus the electric currents flowing through the semiconductor elements can be balanced. As a result, a reactor conventionally arranged downstream of a semiconductor element is not required, and the circuit of the power conversion device can be miniaturized.

Moreover, in the present embodiment, the wiring pattern of the detection circuit 12 is provided so that when an electric current of the same magnitude flows through the first semiconductor switch Q1 and through the second semiconductor switch Q2, a magnetic flux generated from the wiring (wiring of the main current path) routed from the source of the first semiconductor switch Q1 and a magnetic flux generated from the wiring (wiring of the main current path) routed from the source of the second semiconductor switch Q2 equally interlink with the wiring pattern of the detection circuit 12. Accordingly, the detection circuit 12 superimposes an induction voltage suitable for balancing, when the gate voltage is adjusted so that an electric current flowing through the wiring routed from the source of the first semiconductor switch Q1 and an electric current flowing through the wiring routed from the source of the second semiconductor switch Q2 become equal. Moreover, the wirings routed from the sources of the semiconductor elements are mutually arranged horizontally, i.e., the wirings are arranged so that the magnetic flux interlinks with the wiring pattern of the pickup coil, and thus the magnetic field from the wiring increases and the induction voltage generated in the pickup coil can be increased.

In addition, only the gate resistor R1 and the gate resistor R2 for turn-on are connected to the gates of the first semiconductor switch Q1 and the second semiconductor switch Q2 via the detection circuit 12, respectively. Accordingly, turn-off of the first semiconductor switch Q1 and the second semiconductor switch Q2 can be executed at high speed.

Furthermore, when electric currents for driving the first semiconductor switch Q1 and the second semiconductor switch Q2 connected in parallel flow through the both of two pickup coils, these two pickup coils are coupled in a normal mode. When the directions of the electric currents are the same, the inductance of the pickup coil decreases, whereas when the directions of the electric currents are different from each other, the inductance of the pickup coil increases. Accordingly, even when the first semiconductor switch Q1 and the second semiconductor switch Q2 are turned on/off at high speed, the following effects can be obtained: not only a voltage oscillation does not increase, but also a malfunction due to current resonance between the first semiconductor switch Q1 and the second semiconductor switch Q2 arranged in parallel is suppressed.

(Third Embodiment)

A power conversion device according to a third embodiment of the present invention supplies a gate current via the detection circuit not only during turn-on but also during turn-off, in the power conversion device according to the second embodiment. Hereinafter, a description will be given while focusing on the portions different from the second embodiment.

Figure 5:
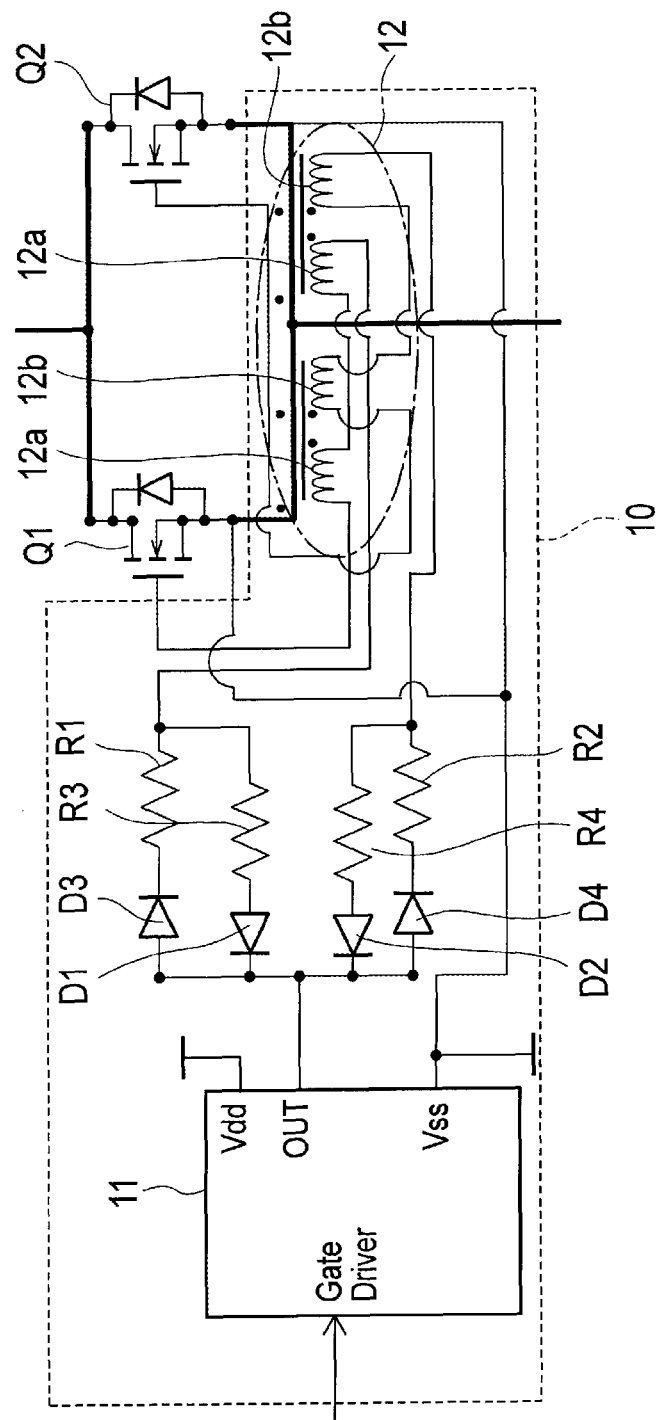
FIG. 5 illustrates a circuit configuration of a power conversion device according to a third embodiment of the present invention.

FIG. 5 illustrates a circuit configuration of the power conversion device according to the third embodiment of the present invention. This power conversion device is constituted by changing the inside of the drive circuit 10 of the power conversion device according to the second embodiment. Namely, in the power conversion device according to the second embodiment, a series circuit including the third gate resistor R3 and the first diode D1 is arranged between the output terminal OUT of the gate drive circuit 11 and the detection circuit 12. In addition, a series circuit including the fourth gate resistor R4 and the second diode D2 is arranged between the output terminal OUT of the gate drive circuit 11 and the detection circuit 12. Moreover, a third diode D3 is added between the output terminal OUT of the gate drive circuit 11 and the first gate resistor R1, and a fourth diode D4 is added between the output terminal OUT of the gate drive circuit 11 and the second gate resistor R2.

Figure 6:
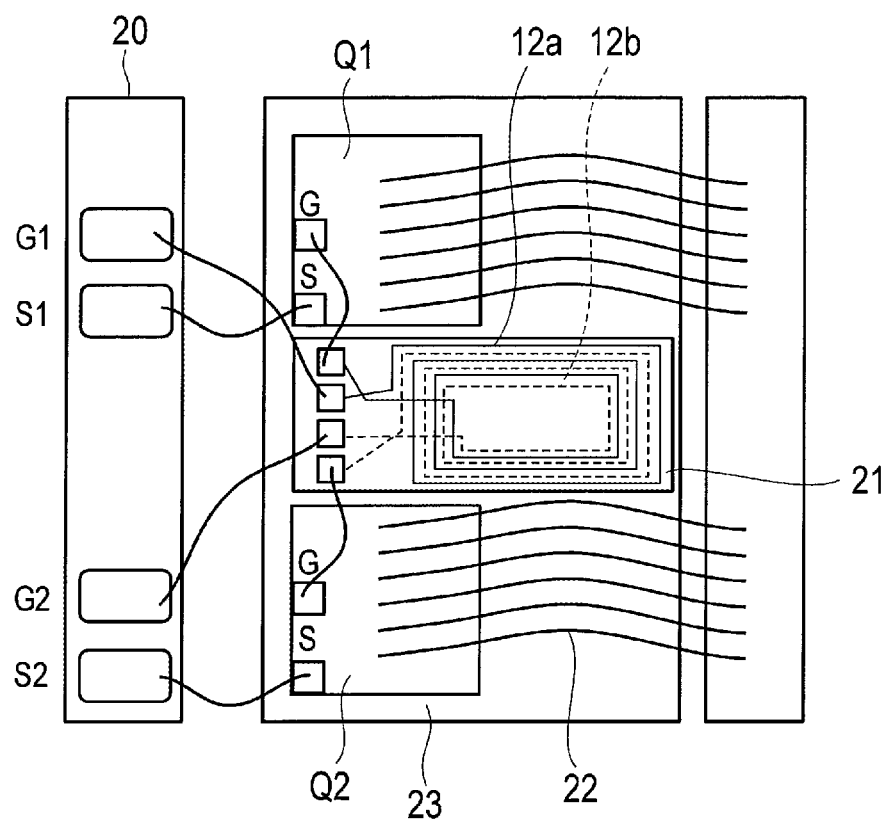
FIG. 6 illustrates a mounting configuration of the power conversion device according to the third embodiment of the present invention.

FIG. 6 illustrates a mounting configuration of the power conversion device according to the third embodiment of the present invention. The terminal plate 20 of the third embodiment is formed by removing the gate terminal G1a and gate terminal G2a from that of the second embodiment. Therefore, the wire for connecting the gate terminal G1a and the gate electrode G of the first semiconductor switch Q1 and the wire for connecting the gate terminal G2a and the gate electrode G of the second semiconductor switch Q2 are removed.

In the power conversion device according to the third embodiment, when the gate drive circuit 11 outputs a drive signal from the output terminal OUT, the drive signal is supplied to the gate of the first semiconductor switch Q1 via the third diode D3, the first gate resistor R1, and the first detection circuit 12a. Accordingly, a current flows through the source of the first semiconductor switch Q1. Similarly, the drive signal output from the output terminal OUT of the gate drive circuit 11 is supplied to the gate of the second semiconductor switch Q2 via the fourth diode D4, the second gate resistor R2, and the second detection circuit 12b. Therefore, an electric current flows through the source of the second semiconductor switch Q2. The subsequent operation is the same as the operation of the second embodiment.

Furthermore, since the third gate resistor R3 for turn-off and the fourth gate resistor R4 for turn-off are connected to the first semiconductor switch Q1 and the second semiconductor switch Q2, respectively, via the detection circuit 12, the gate current during turn-on and the gate current during turn-off pass through the detection circuit 12. As a result, the current flowing through the first semiconductor switch Q1 and the current flowing through the second semiconductor switch Q2 can be balanced not only during turn-on but also during turn-off.

Note that the third diode D3 is provided so that the gate resistor R1 for turn-on does not act during turn-off and the fourth diode D4 is provided so that the gate resistor R2 for turn-on does not act during turn-off. Note that these third diode D3 and fourth diode D4 can also be removed.

(Fourth Embodiment)

Figure 7:
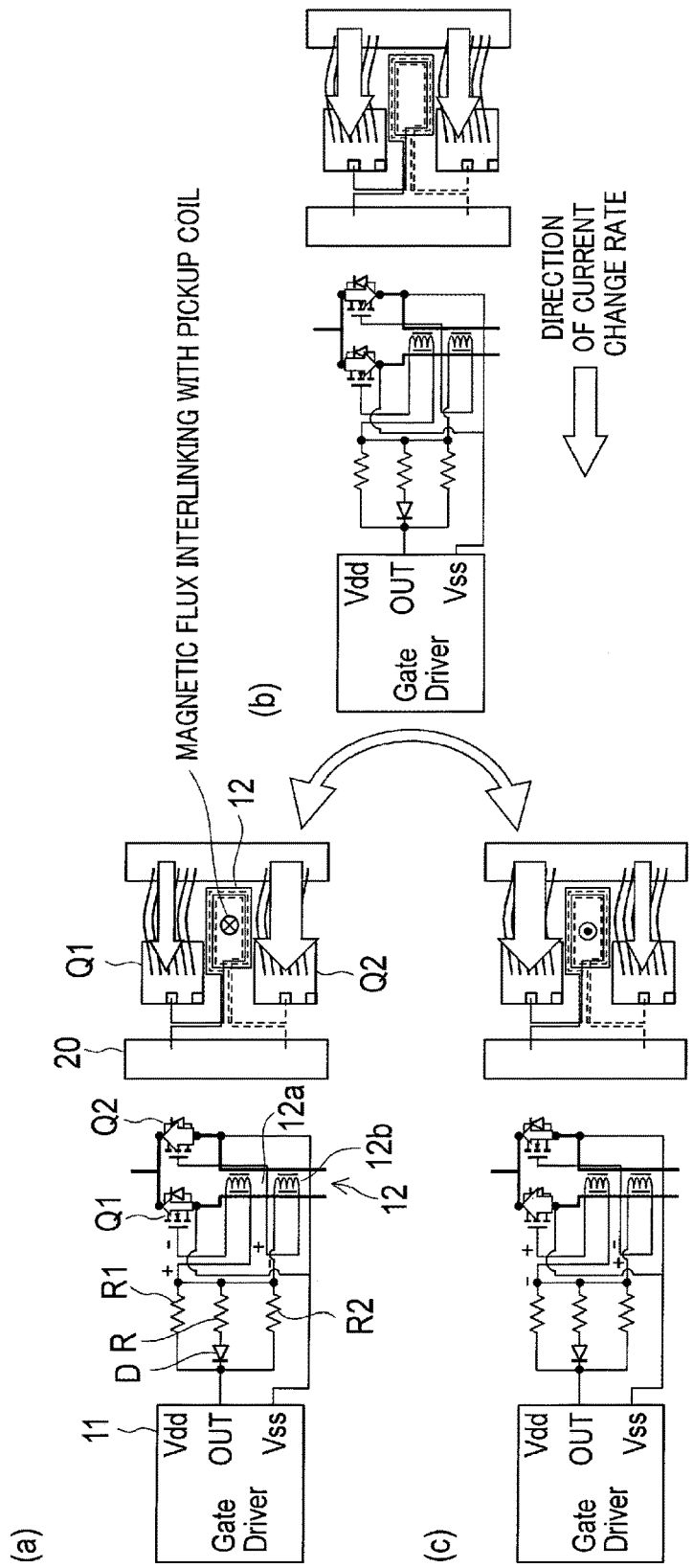
FIG. 7 is a view for explaining a circuit configuration and operation of a power conversion device according to a fourth embodiment of the present invention.

A power conversion device according to a fourth embodiment of the present invention is a modified example of the power conversion device according to the third embodiment. FIG. 7 illustrates a circuit configuration of the power conversion device according to the fourth embodiment of the present invention. Note that, since the circuit diagrams illustrated in FIGS. 7(a) to 7(c) are the same, the reference signs are attached only in FIG. 7(a).

In this power conversion device, one end of the gate resistor R1 and one end of the gate resistor R2 are connected to the output terminal OUT of the gate drive circuit 11. A series circuit including a diode D and a gate resistor R is arranged between a common point at which a connection point between the other end of the gate resistor R1 and the first detection circuit 12a and a connection point between the other end of the gate resistor R2 and the second detection circuit 12b are connected, and the output terminals OUT of the gate drive circuit 11.

In the power conversion device constituted as described above, as illustrated in FIG. 7(a), when a magnetic flux interlinking with a pickup coil travels from the front side to back side of the page, the current change rate of the second semiconductor switch Q2 becomes larger than the current change rate of the first semiconductor switch Q1. As illustrated in FIG. 7(c), when the magnetic flux interlinking with a pickup coil travels from the back side to front side of the page, the current change rate of the first semiconductor switch Q1 becomes larger than the current change rate of the second semiconductor switch Q2. As illustrated in FIG. 7(b), when there is no magnetic flux interlinking with a pickup coil, the current change rate of the second semiconductor switch Q2 and the current change rate of the first semiconductor switch Q1 become equal.

Figure 8:
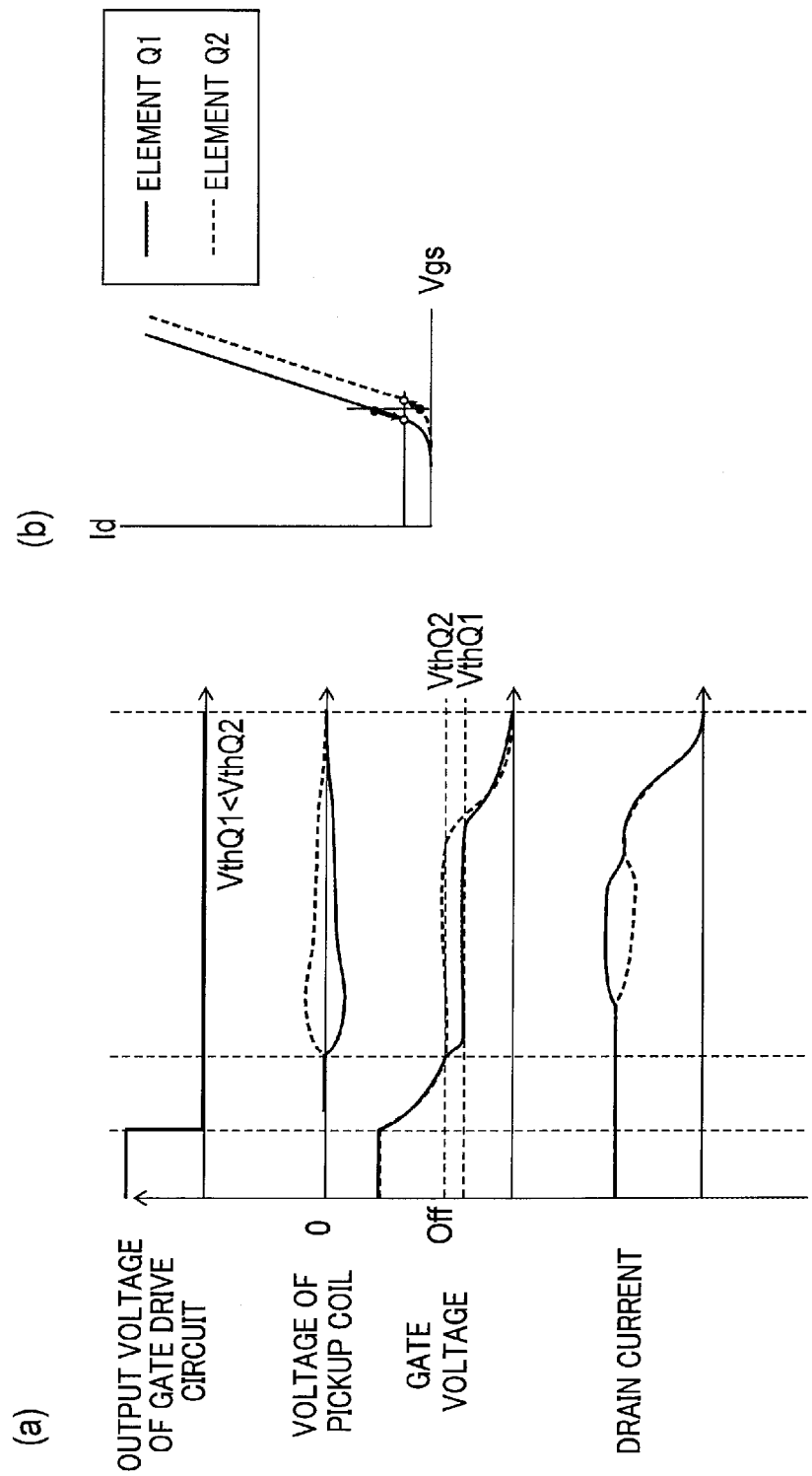
FIG. 8 is a timing chart for explaining the operation of the power conversion device according to the fourth embodiment of the present invention.

FIG. 8 is a view for explaining the operation of the power conversion device according to the fourth embodiment, in which FIG. 8(a) is a timing chart for explaining the balancing between the currents during turn-off. FIG. 8(b) illustrates Id-Vgs characteristics of the first semiconductor switch Q1 and the second semiconductor switch Q2. Here, it is assumed that a threshold VthQ2 of the second semiconductor switch Q2 is larger than a threshold VthQ1 of the first semiconductor switch Q1. As illustrated, as soon as the drain current Id starts to decrease, the power conversion device acts so that the current of the first semiconductor switch Q1 and the current of the second semiconductor switch Q2 are balanced.

(Fifth Embodiment)

A power conversion device according to a fifth embodiment of the present invention is an example in the case where the number of semiconductor elements in parallel is equal to or more than three. Hereinafter, a description will be given while a case where the number of semiconductor elements in parallel is four is taken as an example. Note that, since the circuit configuration of the power conversion device according to the fifth embodiment is realized only by increasing the number of components used in the second embodiment along with an increase in the number of semiconductor elements, the detailed description thereof will be omitted here.

Figure 9:
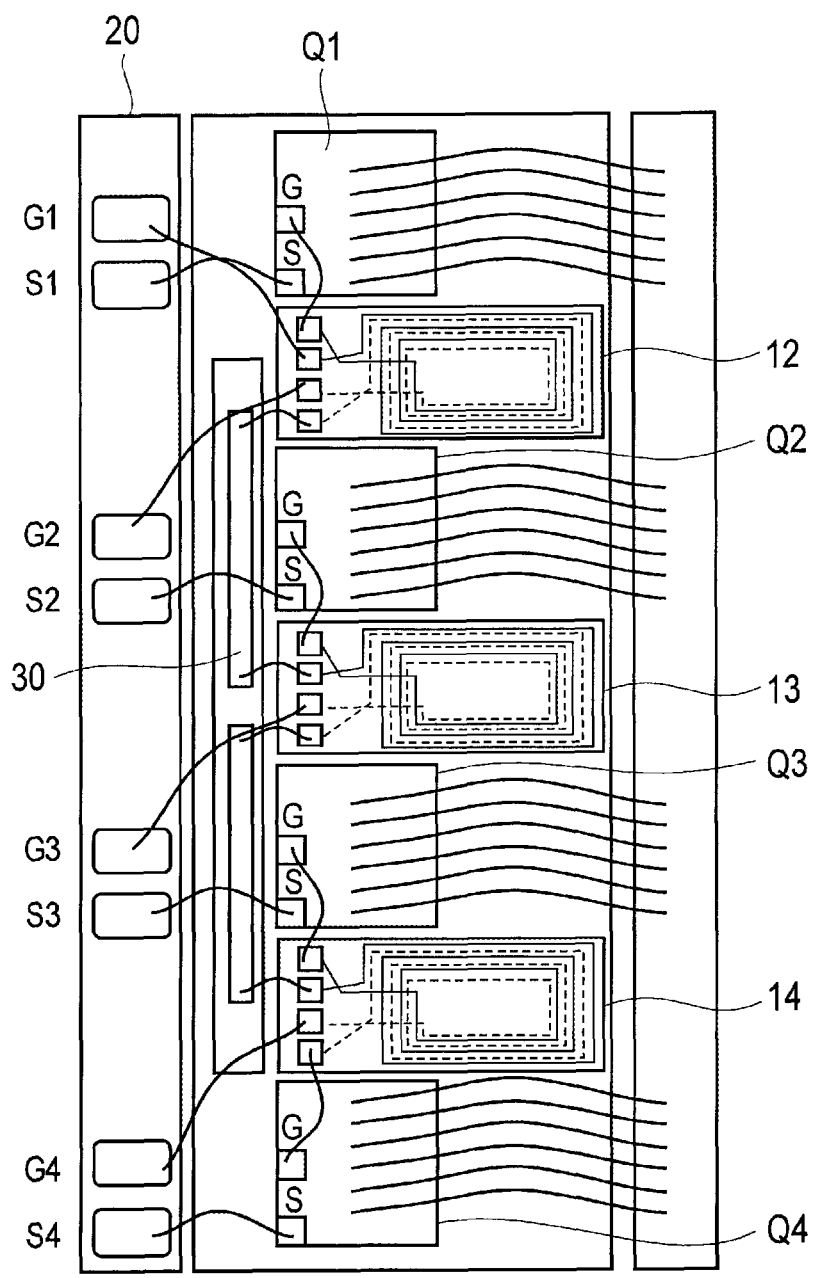
FIG. 9 illustrates a mounting configuration of a power conversion device according to a fifth embodiment of the present invention.

FIG. 9 illustrates a mounting configuration of the power conversion device according to the fifth embodiment. This power conversion device includes the first semiconductor switch Q1 to a fourth semiconductor switch Q4. The first semiconductor switch Q1 to the fourth semiconductor switch Q4 correspond to a plurality of semiconductor elements of the present invention.

The detection circuit 12 is provided between the first semiconductor switch Q1 and the second semiconductor switch Q2, a detection circuit 13 is provided between the second semiconductor switch Q2 and the third semiconductor switch Q3, and a detection circuit 14 is provided between the third semiconductor switch Q3 and the fourth semiconductor switch Q4.

The terminal plate 20 has the gate terminals G1 to G4 and the source terminals S1 to S4 provided therein. The gate terminal G1 is connected to one end of a pickup coil forming the detection circuit 12, and the other end of the pickup coil is connected to the gate electrode of the first semiconductor switch Q1. The source terminal S1 is connected to the source electrode of the first semiconductor switch Q1.

The gate terminal G2 is connected to one end of another pickup coil forming the detection circuit 12, and the other end of this pickup coil is connected to the gate electrode G of the second semiconductor switch Q2 via a detection circuit connection member 30. The source terminal S2 is connected to the source electrode of the second semiconductor switch Q2. Furthermore, the gate terminal G2 is connected to one end of a pickup coil forming the detection circuit 13 via the detection circuit connection member 30, and the other end of this pickup coil is connected to the gate electrode of the second semiconductor switch Q2.

The gate terminal G3 is connected to one end of another pickup coil forming the detection circuit 13, and the other end of the another pickup coil is connected to the gate electrode of the third semiconductor switch Q3 via the detection circuit connection member 30. The source terminal S3 is connected to the source electrode of the third semiconductor switch Q3. Moreover, the gate terminal G3 is connected to one end of a pickup coil forming the detection circuit 14 via the detection circuit connection member 30, and the other end of this pickup coil is connected to the gate electrode of the third semiconductor switch Q3.

The gate terminal G4 is connected to one end of another pickup coil forming the detection circuit 14, and the other end of the another pickup coil is connected to the gate electrode of the fourth semiconductor switch Q4. The source terminal S4 is connected to the source electrode of the fourth semiconductor switch Q4.

With the above-described configuration, two pickup coils of the detection circuit connected to the adjacent semiconductor switches are inductively coupled. Therefore, the current of the first semiconductor switch Q1 and the current of the second semiconductor switch Q2, the current of the second semiconductor switch Q2 and the current of the third semiconductor switch Q3, and the current of the third semiconductor switch Q3 and the current of the fourth semiconductor switch Q4 act to be balanced, respectively. Accordingly, the currents flowing respectively through all of the first semiconductor switch Q1 to the fourth semiconductor switch Q4 are balanced.

In the power conversion device according to the fifth embodiment, since a pickup coil is provided adjacent to the wirings routed from the sources of the semiconductor element at both ends, the currents flowing through the semiconductor elements at both ends can be further balanced.

(Sixth Embodiment)

In a power conversion device according to a sixth embodiment of the present invention, the currents flowing through the first semiconductor switch Q1 and the fourth semiconductor switch Q4 arranged at both ends in the power conversion device according to the fifth embodiment are also balanced.

Figure 10:
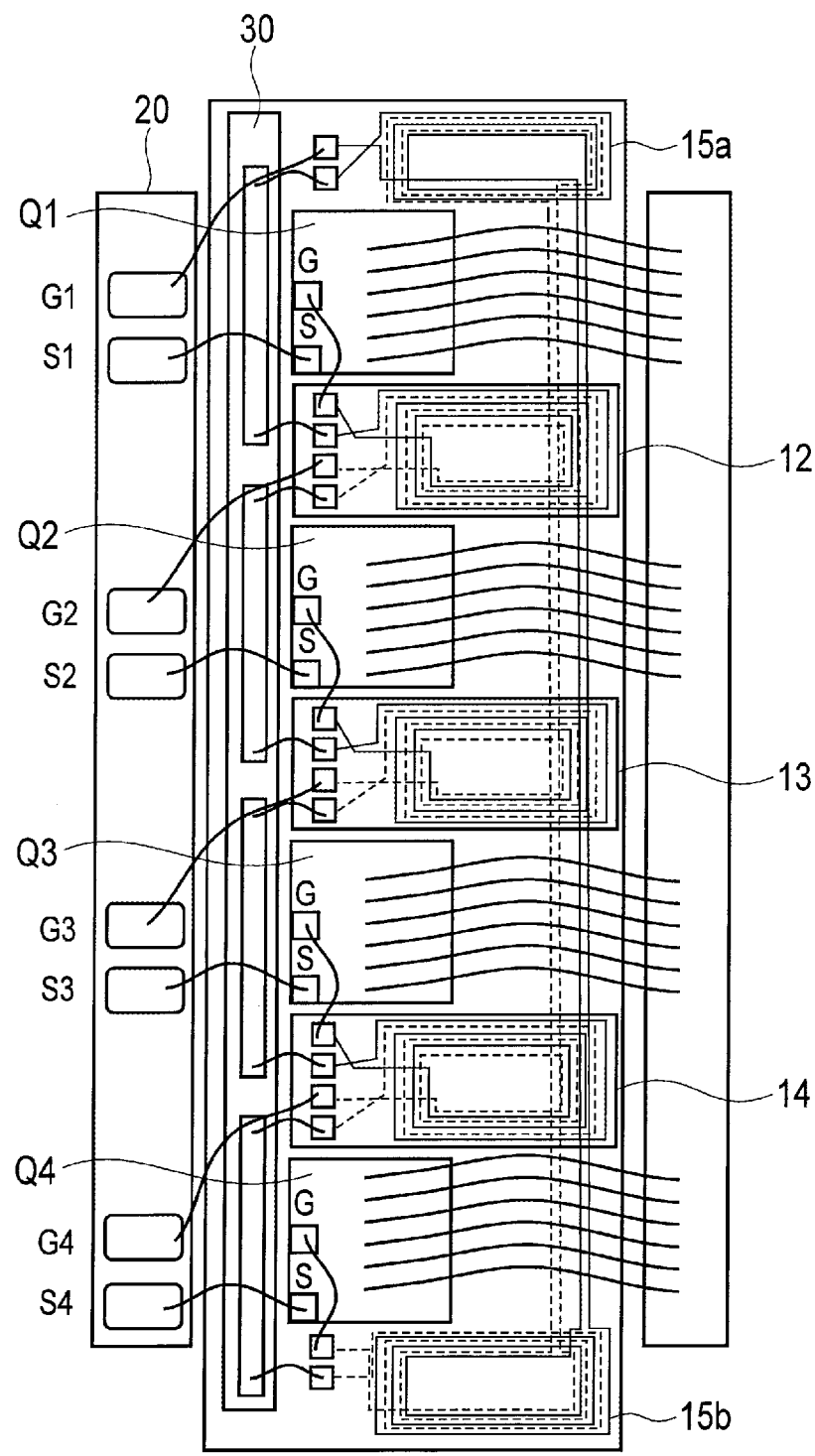
FIG. 10 illustrates a mounting configuration of a power conversion device according to a sixth embodiment of the present invention.

FIG. 10 illustrates a mounting configuration of the power conversion device according to the sixth embodiment. In this power conversion device, a detection circuit 15a including a pickup coil whose number of turns is half that of each of the detection circuits 12 to 14 is provided on the opposite side of the detection circuit 12 with the first semiconductor switch Q1 in between. Moreover, a detection circuit 15b including a pickup coil whose number of turns is half that of each of the detection circuits 12 to 14 is provided on the opposite side of the detection circuit 14 with the fourth semiconductor switch Q4 in between. The pickup coil of the detection circuit 15a and the pickup coil of the detection circuit 15b are connected in series.

More specifically, the gate terminal G1 is connected to one end of the pickup coil forming the detection circuit 15a, and the other end of this pickup coil is connected to the gate electrode of the first semiconductor switch Q1 via the detection circuit connection member 30 and the detection circuit 12.

Furthermore, the gate terminal G4 is connected to one end of the pickup coil forming the detection circuit 15b via the detection circuit 14 and the detection circuit connection member 30, and the other end of this pickup coil is connected to the gate electrode of the fourth semiconductor switch Q4.

With the above configuration, the current of the first semiconductor switch Q1 and the current of the second semiconductor switch Q2, the current of the second semiconductor switch Q2 and the current of the third semiconductor switch Q3, and the current of the third semiconductor switch Q3 and the current of the fourth semiconductor switch Q4 can be balanced, respectively. In addition, operation can be obtained in which the current of the fourth semiconductor switch Q4 and the current of the first semiconductor switch Q1 are also balanced. Accordingly, even when an excessive current flows through the first semiconductor switch Q1 or the fourth semiconductor switch Q4 at both ends, the currents of all the semiconductor switches can be promptly balanced.

Furthermore, a twisted wire is preferably used as the wire rod of the pickup coil extending over the first semiconductor switch Q1 to the fourth semiconductor switch Q4. Thus, the influence of an unintentional current change of a semiconductor switch can be avoided.

Moreover, as in the fifth embodiment, the effect of balancing the currents flowing through the semiconductor switches can be obtained even in a power conversion device including the arbitrary number of semiconductor switches in parallel.

Moreover, with a configuration similar to those of the detection circuits 15a and 15b for detecting a current difference between the semiconductor switches at both ends, the currents can also be constituted so as to be balanced between the semiconductor switches away from each other. For example, the currents can be balanced between the semiconductor switches away from each other, such as the first semiconductor switch Q1 and the third semiconductor switch Q3 or the second semiconductor switch Q2 and the fourth semiconductor switch Q4.

Further and additionally, in the present embodiment, one gate drive circuit is provided and a drive signal is transmitted from this gate drive circuit to a plurality of semiconductor elements, but is not necessarily limited thereto, and the drive circuit may be provided for each semiconductor element or the gate drive circuit may be provided for each predetermined number of semiconductor elements.

REFERENCE SIGNS LIST 10 drive circuit
11 gate drive circuit
12 to 14, 15a, 15b detection circuit
12a first detection circuit
12b second detection circuit
20 terminal plate
21 insulating member
22 upper-surface electrode extraction section
23 lower-surface electrode pattern
Q1 to Q4 first semiconductor switch to fourth semiconductor switch
R, R1 to R4 resistor, first gate resistor to fourth gate resistor
D, D1 to D4 diode
G gate electrode
S source electrode

The invention claimed is:

1. A power conversion device comprising:
a plurality of semiconductor elements provided in parallel;
a gate drive circuit configured to send a drive signal to each gate of the plurality of semiconductor elements; and
a gate voltage adjustment circuit configured to act on the drive signal from the gate drive circuit and adjust a gate voltage of a semiconductor element, wherein
the gate voltage adjustment circuit superimposes an induction voltage generated on a basis of a difference between a magnetic flux due to a current flowing through one of the plurality of semiconductor elements and a magnetic flux due to a current flowing through each of the other semiconductor elements, onto a gate voltage sent to at least one gate of the plurality of semiconductor elements,
the gate voltage adjustment circuit includes a plurality of wiring patterns formed between the plurality of semiconductor elements and the gate drive circuit, and
the gate voltage adjustment circuit is provided between wirings routed from one semiconductor element and each of the other semiconductor elements among the plurality of semiconductor elements, the wirings serving as a main current path.

2. The power conversion device according to claim 1, wherein
when a threshold voltage of one semiconductor element of the plurality of semiconductor elements is lower than a threshold voltage of each of the other semiconductor elements, the gate voltage adjustment circuit suppresses an increase in a current flowing through the one semiconductor element.

3. The power conversion device according to claim 1, wherein
when a threshold voltage of one semiconductor element of the plurality of semiconductor elements is higher than a threshold voltage of each of the other semiconductor elements, the gate voltage adjustment circuit promotes an increase in a current flowing through the one semiconductor element.

4. The power conversion device according to claim 1, wherein
the gate voltage adjustment circuit includes a plurality of gate voltage adjustment sections respectively corresponding to the plurality of semiconductor elements, and
two adjacent gate voltage adjustment sections are inductively coupled so that an inductive component decreases when directions of currents flowing into gates of the two semiconductor elements respectively connected to the two gate voltage adjustment sections are the same and so that the inductive component increases when the directions are different from each other.

5. The power conversion device according to claim 1, wherein
when a current flowing through a main current path of the one semiconductor element and a current flowing through a main current path of each of the other semiconductor elements are the same, the gate voltage adjustment circuit is provided so that a magnetic flux generated from a wiring serving as the main current path of the one semiconductor element and a magnetic flux generated from a wiring serving as the main current path of each of the other semiconductor elements equally interlink with the wiring pattern.

6. The power conversion device according to claim 1, wherein
the plurality of semiconductor elements includes three or more semiconductor elements provided in parallel, and
gate voltage adjustment circuits of semiconductor elements at both ends of the three or more semiconductor elements are provided adjacent to a wiring routed from a source of at least one of the semiconductor elements at both ends.

7. The power conversion device according to claim 1, further comprising,
a speed control resistor for suppressing a steep change of a current driving each gate of the plurality of semiconductor elements, between each gate and the gate drive circuit.

8. The power conversion device according to claim 7, wherein
the speed control resistor includes a speed control resistor for turn-on of each of the plurality of semiconductor elements and a speed control resistor for turn-off thereof, provided in parallel,
the speed control resistor for turn-on is connected to each gate of the plurality of semiconductor elements via the gate voltage adjustment circuit, and
the speed control resistor for turn-off is directly connected to each gate of the plurality of semiconductor elements.

9. The power conversion device according to claim 7, wherein
the speed control resistor includes a speed control resistor for turn-on of each of the plurality of semiconductor elements and a speed control resistor for turn-off thereof, provided in parallel, and the speed control resistor for turn-off and the speed control resistor for turn-on are connected to each gate of the plurality of semiconductor elements via the gate voltage adjustment circuit.

* * * * *